(12) United States Patent
Thewes et al.

(10) Patent No.: US 6,580,636 B2
(45) Date of Patent: Jun. 17, 2003

(54) MAGNETORESISTIVE MEMORY WITH A LOW CURRENT DENSITY

(75) Inventors: Roland Thewes, Gröbenzell (DE); Werner Weber, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/822,019

(22) Filed: Mar. 30, 2001

(65) Prior Publication Data

US 2001/0030886 A1 Oct. 18, 2001

Related U.S. Application Data

(63) Continuation of application No. PCT/DE99/02983, filed on Sep. 17, 1999.

(30) Foreign Application Priority Data

Sep. 30, 1998 (DE) .......................... 198 45 068

(51) Int. Cl.[7] ................................ G11C 11/00
(52) U.S. Cl. ............... 365/158; 365/171; 365/173
(58) Field of Search .......................... 365/158, 171, 365/173; 257/295, 390, 421

(56) References Cited

U.S. PATENT DOCUMENTS

| 3,604,109 A | * | 9/1971 | Crimmins ............... 365/171 |
| 4,455,626 A | | 6/1984 | Lutes .................... 365/158 |
| 5,587,943 A | * | 12/1996 | Torok et al. ............ 365/158 |
| 5,902,690 A | | 5/1999 | Tracy et al. ............ 428/693 |
| 5,920,500 A | | 7/1999 | Tehrani et al. .......... 365/173 |
| 6,028,786 A | * | 2/2000 | Nishimura .............. 365/171 |

FOREIGN PATENT DOCUMENTS

| EP | 0 776 011 A2 | 5/1997 |
| EP | 0 875 901 A2 | 11/1998 |

* cited by examiner

Primary Examiner—Richard Elms
Assistant Examiner—Jung H. Hur
(74) Attorney, Agent, or Firm—Laurence A. Greenberg; Werner H. Stemer; Ralph E. Locher

(57) ABSTRACT

The magnetoresistive memory has a reduced current density in the bit lines and/or word lines. This avoids electromigration problems. The current density is reduced such that a compact field concentration is attained, for example, by the use of ferrite in the area around the magnetic memory cells.

5 Claims, 2 Drawing Sheets

MAGNETORESISTIVE MEMORY WITH A LOW CURRENT DENSITY

CROSS-REFERENCE TO RELATED APPLICATION

This application is a continuation of copending International Application No. PCT/DE99/02983, filed Sep. 17, 1999, which designated the United States.

BACKGROUND OF THE INVENTION

Field of the Invention

The invention relates to a magnetoresistive random-access memory (MRAM), whose storage effect resides in the magnetically variable electrical resistance of the memory cell.

Magnetoresistive memories have a magnetoresistive layer system between, for example, a word line and a bit line. The layer system comprises, for example, a soft-magnetic layer and a hard-magnetic layer, which are isolated by a thin tunnel oxide. The resistance between the bit line and the word line depends, then, on whether the magnetization directions in the materials are parallel or antiparallel. Parallel magnetization leads to a lower resistance and antiparallel magnetization direction leads to a higher resistance. In many respects, the relatively high currents or current peaks, required in particular for cell writing, in the word and bit lines are disadvantageous because the current densities resulting therefrom lead to electromigration problems, and to a relatively high power loss. Furthermore, the relatively high currents mean that increased requirements are placed on the peripheral circuits. Since the materials for the bit and word lines must, for example, be process-compatible, readily patternable and have a low resistivity, electromigration problems can be avoided only to a very limited extent by a suitable choice of the line materials. The reduction of the required currents by using thinner magnetic layers encounters technological limits and causes greater reliability problems as the layer thickness decreases. Moreover, from today's standpoint, it cannot be assumed that material-specific optimizations will make a significant contribution to the reduction of the required currents in the foreseeable future.

U.S. Pat. No. 4,455,626 discloses an MRAM whose magnetoresistive layer is situated in a gap in a thicker field concentrator layer. In that case, a memory layer and the field concentrator layer constitute a magnetic path to the magnetoresistive layer.

Furthermore, U.S. Pat. No. 6,028,786 (European published patent application EP 0 875 901 A3) discloses a magnetoresistive memory in which a material having a high relative permeability is used in order to effect a reduction in the current density required for writing.

SUMMARY OF THE INVENTION

It is accordingly an object of the invention to provide a magnetoresistive random-access memory, which overcomes the above-mentioned disadvantages of the heretofore-known devices and methods of this general type and in which, with the smallest possible chip area, the current density in the bit and word lines is as low as possible.

With the foregoing and other objects in view there is provided, in accordance with the invention, a magnetoresistive memory, comprising:

two layers formed of a material of a high relative permeability;

magnetic memory cells with associated bit lines and word lines formed between the two layers;

a filling of electrically insulating material having a large relative permeability disposed in at least one region selected from the group consisting of a region laterally between the bit lines, a region laterally between the memory cells, and a region laterally between the word lines.

In accordance with an added feature of the invention, the two layers are electrical insulators, and one of the two layers makes contact with the word line and the other of the two layers makes contact with the bit line.

In accordance with an additional feature of the invention, at least one of the two layers and/or the filling in at least one of the regions is formed of a ferrite.

In accordance with another feature of the invention, the regions are all filled with the same material.

With the above and other objects in view there is also provided, in accordance with an alternative feature of the invention, a magnetoresistive memory which comprises:

bit lines and word lines;

magnetic memory cells disposed at cross-over points of the bit lines and the word lines;

two layers of a material having high relative permeability enclosing therebetween the memory cells with the bit lines and word lines; and a layer of an electrically insulating material having a low relative permeability between the memory cells with the bit lines and word lines and at least one of the two layers.

In accordance with a concomitant feature of the invention, the layer of the electrically insulating material having a low relative permeability fills a space between the two layers and the memory cells together with the bit and word lines in a region of the memory cells.

Other features which are considered as characteristic for the invention are set forth in the appended claims.

Although the invention is illustrated and described herein as embodied in a magnetoresistive memory with a low current density, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

The invention is principally based on the fact that, on account of improved coupling of a magnetic field generated by the bit lines and/or the word lines into the magnetoresistive memory cell, a lower current density is required in these lines. The invention makes this possible in a particularly space-saving and efficient manner.

Figure 1A:
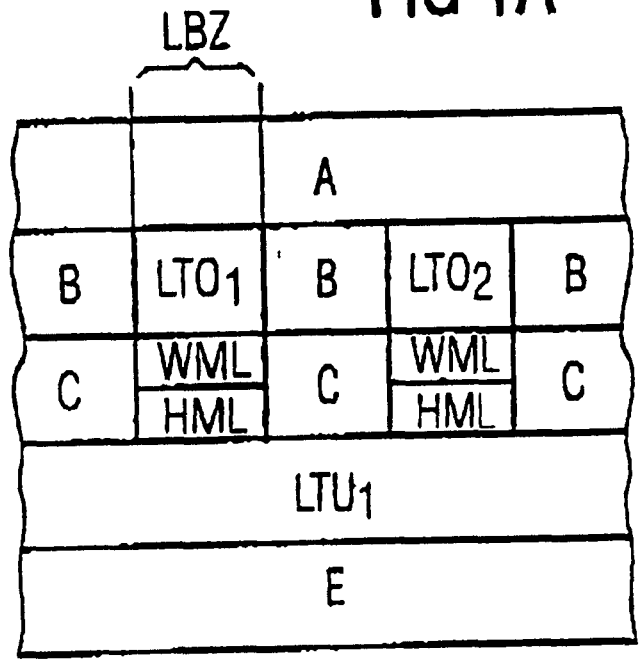
FIGS. 1A and 1B show two mutually orthogonal sections taken through a first exemplary embodiment of a magnetoresistive memory cell.

Referring now to the figures of the drawing in detail and first, particularly, to FIG. 1A thereof, there is shown a sectional illustration in the region of two magnetoresistive cells. Such magnetoresistive memory cells comprise, for example, a soft-magnetic layer WML which is isolated from a hard-magnetic layer by a tunnel oxide. The tunnel oxide is represented by the line between the boxes WML and HML. The tunneling probability, and hence the electrical resistance between the two layers, depends on the magnetization direction of the two layers. The magnetoresistive memory cells are respectively indicated by the soft-magnetic layer WML and the hard-magnetic layer HML and are situated at crossover points between bit lines and word lines. Regions C composed of an electrically insulating material having a high relative permeability are situated laterally between the cells with the layers WML and HML. Moreover, a region B made of electrically insulating material having a high relative permeability is likewise situated laterally between at least two lines $LTO_1$ and $LTO_2$, for example bit lines.

The memory cell WML, HML and the tunnel oxide between the two magnetic layers, together with the associated segment of the bit line LTO and the associated segment of the word line LTU is laterally defined within the vertical box LBZ. The cells of the magneto-resistive memory are therefore vertical stacks that are bounded by the materials in the regions B, C, D.

Figure 1B:
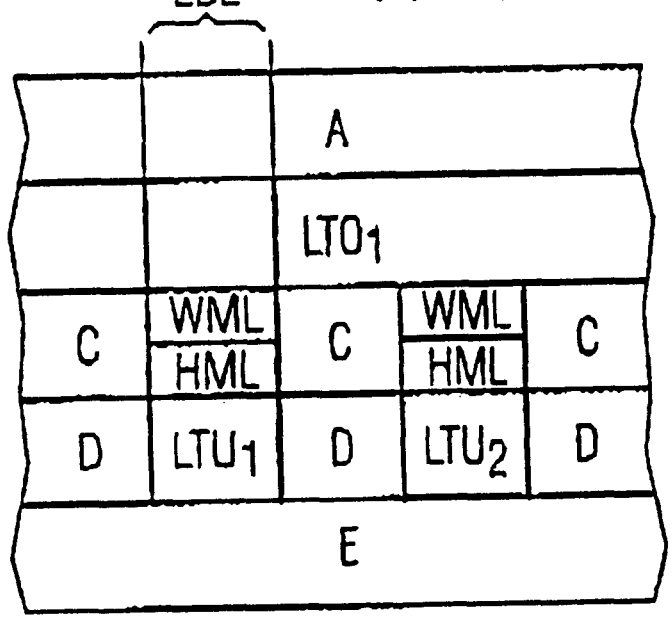

The section of FIG. 1B is orthogonal to the section of FIG. 1A and shows, moreover, regions D laterally between at least two lines $LTU_1$ and $LTU_2$, for example word lines, made of an electrically insulating material having a high relative permeability. Moreover, in FIGS. 1A and 1B, a continuous layer A made of an electrically insulating material having a high relative permeability is present. The layer A directly adjoins the bit lines $LTO_1$ and $LTO_2$, and a further continuous layer E made of an electrically insulating material having a high relative permeability is present. The layer E adjoins the word lines $LTU_1$ and $LTU_2$. What this brings about, at the same time in a very space-saving manner, is the insulation of the individual memory cells and, at the same time, a field concentration for reducing the required current density.

The regions C, B, and D here are referred to as fillings, because the high-permeability material essentially fills the spaces between the cells WML, HML, between the word lines, and the bit lines.

The layers A and E and the regions B, C and D may be composed of different or, alternatively, identical electrically insulating materials having a high relative permeability. By way of example, ferrites are suitable as material for the layers A and E and for the regions B, C, and D. It will also be understood that, while the term high relative permeability may be a relative term, the same is understood by those of skill in the pertinent art to be accurately defined in the magnetoresistive memory context.

Figure 2A:
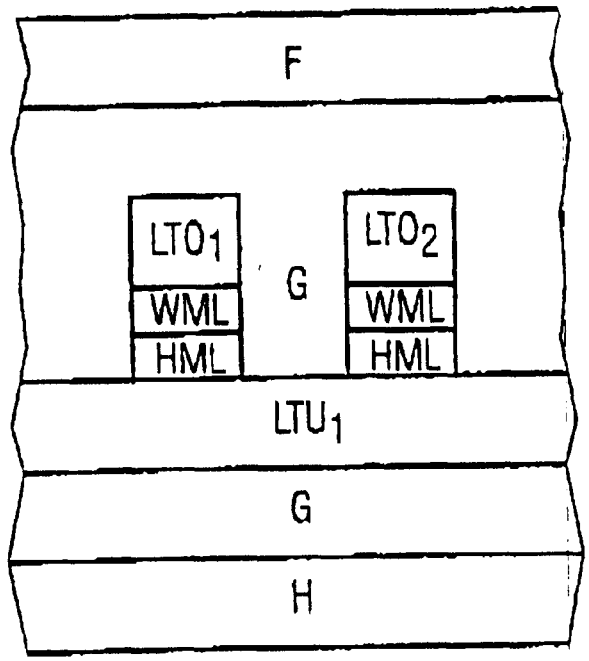
FIGS. 2A and 2B show two mutually orthogonal sections taken through a second exemplary embodiment of a magnetoresistive memory cell according to the invention.
Figure 2B:
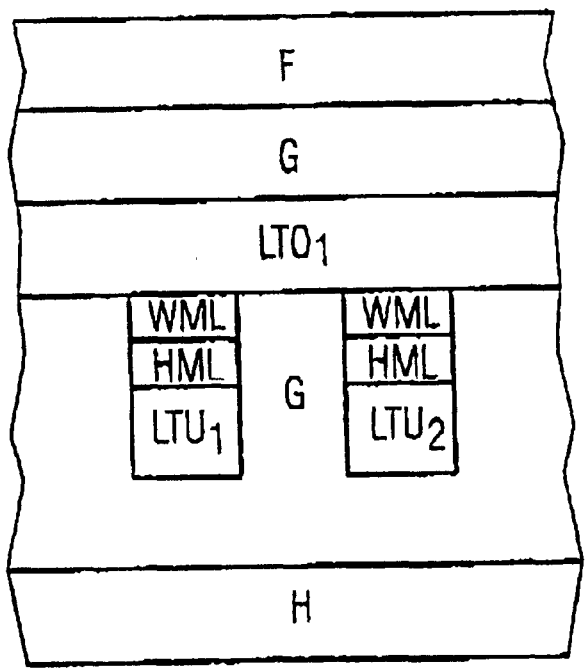

A further alternative is illustrated in two mutually orthogonal sections in FIGS. 2A and 2B, two magnetoresistive memory cells being illustrated between two layers F and H made of an electrically conductive or poorly insulating material having a high permeability. The essential difference from the first alternative is, however, that the layers F and H make contact neither with the bit lines nor with the word lines. Rather, they are isolated therefrom by an electrically insulating material having a relatively low relative permeability. This makes it possible, for example, to use electrically conductive or poorly insulating materials having a high relative permeability, since, as a result of the electrically insulating material, the bit and word lines and also the memory cells themselves are not short-circuited or bridged.

The layers F and H may be composed of different or else identical electrically conductive or, alternatively, electrically non-conductive materials having a high relative permeability. Electrically conductive layers having a high relative permeability are usually alloys of iron, nickel and/or cobalt. The layer G can fill the entire space between the layers F and H and the memory cells together with word and bit lines. The material of the layer G is an electrical insulator having a low relative permeability and is composed, for example, of silicon dioxide or silicon nitride.

In further embodiments, it is also possible for only the regions B and/or C and/or D to be composed of an electrically insulating material having a high relative permeability, e.g. ferrite.

We claim:

1. A magnetoresistive memory, comprising:

two layers formed of a material of a high relative permeability;

magnetic memory cells with associated bit lines and word lines formed between said two layers, said magnetic memory cells located between said bit lines and said word lines; and a filling of electrically insulating material having a large relative permeability disposed in a region laterally between said bit lines, a region laterally between said memory cells, and a region laterally between said word lines.

2. The magnetoresistive memory according to claim 1, wherein said two layers are electrical insulators, and one of said two layers makes contact with said word line and the other of said two layers makes contact with said bit line.

3. The magnetoresistive memory according to claim 1, wherein at least one of said two layers is formed of a ferrite.

4. The magnetoresistive memory according to claim 1, wherein said filling in at least one of said regions is composed of ferrite.

5. The magnetoresistive memory according to claim 1, wherein each of said regions are filled with the same material.

* * * * *